United States Patent
Kashimura (10) Patent No.: US 7,924,612 B2
(45) Date of Patent: Apr. 12, 2011

(54) NONVOLATILE SEMICONDUCTOR MEMORY, AND METHOD FOR READING DATA

(75) Inventor: Masahiko Kashimura, Kanagawa (JP)

(73) Assignee: RENESAS Electronics Corporation, Kawasaki-shi, Kanagawa (JP)

( * ) Notice: Subject to any disclaimer, the term of this patent is extended or adjusted under 35 U.S.C. 154(b) by 88 days.

(21) Appl. No.: 12/458,227

(22) Filed: Jul. 6, 2009

(65) Prior Publication Data
US 2010/0118609 A1 May 13, 2010

(30) Foreign Application Priority Data

Jul. 11, 2008 (JP) .................................. 2008-181143

(51) Int. Cl.
*G11C 16/04* (2006.01)
(52) U.S. Cl. ......... 365/185.03; 365/185.14; 365/185.26; 365/185.27
(58) Field of Classification Search ............. 365/185.03, 365/185.14, 185.26, 185.27
See application file for complete search history.

(56) References Cited

U.S. PATENT DOCUMENTS

| | | | | |
|---|---|---|---|---|
| 5,808,936 A | * | 9/1998 | Nakayama | ............... 365/185.18 |
| 6,735,118 B2 | | 5/2004 | Ogura et al. | |
| 6,934,195 B2 | * | 8/2005 | Cernea | ..................... 365/185.33 |
| 7,525,145 B2 | * | 4/2009 | Shukuri | ........................ 257/311 |

* cited by examiner

*Primary Examiner* — Pho M. Luu
(74) *Attorney, Agent, or Firm* — McGinn IP Law Group, PLLC

(57) ABSTRACT

A nonvolatile semiconductor memory includes a memory cell, a first gate control circuit that is coupled to the memory cell, and a second gate control circuit that is coupled to the memory cell. The memory cell includes a first gate electrode that is formed above a channel region in a semiconductor substrate, a second gate electrode that is formed beside the first gate electrode, and that is capacitively coupled with the first gate electrode through a first insulating layer, and a charge trapping layer that is formed between the channel region and the second gate electrode, and that includes a second insulating layer for trapping a charge. Data stored in a memory cell transistor including the second gate electrode changes depending on an amount of the charge trapped in the charge trapping layer. The first gate control circuit applies a potential to the first gate electrode, when reading the data stored in the memory cell transistor. The second gate control circuit brings the second gate electrode into a floating state, when the potential is applied to the first gate electrode.

21 Claims, 10 Drawing Sheets

[ PRECHARGE ]  $V_{cg} = V_s = V_g - V_t = \underline{V_{pre}}$ $\begin{bmatrix} \text{WL, bit} \\ \text{ON} \end{bmatrix}$  $V_{cg} = V_{pre} + CR1 \times V_{wg} + CR2 \times V_{bit}$

Fig. 7

<READ>

[PRECHARGE]   $V_{cg} = V_{pre} = V_g - V_t = 2V - 1V = 1V$ $\begin{bmatrix} WL, bit \\ ON \end{bmatrix}$   $V_{cg} = V_{pre} + CR1 \times V_{wg} + CR2 \times V_{bit}$
                       $= 1V + 0.6 \times 2.5V + 0.3 \times 0V$
                       $= 2.5V$

Fig. 8

[PRECHARGE]  Vg = Vg_on
             Vcg = Vpre $\begin{bmatrix} \text{WL, bit} \\ \text{ON} \end{bmatrix}$ Vg = Vg_off
              Vcg = Vpre + CR1 × Vwg + CR2 × Vbit

Fig. 9

<READ>

Vd = Vpre = 1V

Vg = $\begin{cases} \text{Vg\_on} = 2.5\text{V} \\ \text{Vg\_off} = 0\text{V} \end{cases}$

Vcg = Vs

[PRECHARGE] Vg = Vg_on = 2.5V
Vcg = Vpre = 1V $\begin{bmatrix} \text{WL, bit} \\ \text{ON} \end{bmatrix}$ Vg = Vg_off = 0V
Vcg = Vpre + CR1 × Vwg + CR2 × Vbit
= 1V + 0.6 × 2.5V + 0.3 × 0V
= 2.5V

Fig. 10

<READ>

[ PRECHARGE ]   Vg = Vg_on = 0V
                Vcg = Vpre = 1V $\begin{bmatrix} WL, bit \\ ON \end{bmatrix}$   Vg = Vg_off = 2.5V
   Vcg = Vpre + CR1 × Vwg + CR2 × Vbit
       = 1V + 0.6 × 2.5V + 0.3 × 0V
       = 2.5V

NONVOLATILE SEMICONDUCTOR MEMORY, AND METHOD FOR READING DATA

INCORPORATION BY REFERENCE

This application is based upon and claims the benefit of priority from Japanese Patent Application No. 2008-181143 which was filed on Jul. 11, 2008, the disclosure of which is incorporated herein in its entirety by reference.

BACKGROUND OF THE INVENTION

1. Field of the Invention

The present invention relates to a nonvolatile semiconductor memory, and to a method for reading data from the nonvolatile semiconductor memory. More particularly, the present invention relates to a nonvolatile semiconductor memory of a charge trapping-type, and to a method for reading data from the nonvolatile semiconductor memory of the charge trapping-type.

2. Description of Related Art

Flash memories and charge trapping memories are known as "electrically erasable/rewritable nonvolatile semiconductor memories." Among them, charge trapping memories store data by using devices which trap charge. For example, metal oxide nitride oxide silicon (MONOS) transistors are charge trapping devices. The MONOS transistors are a kind of metal insulator silicon (MIS) transistors and use, as their gate insulating film, an oxide nitride oxide (ONO) film which has a silicon oxide, a silicon nitride and a silicon oxide film stacked in this order.

The silicon nitride film of the ONO film has a property to trap charge. For example, electrons can be injected into the silicon nitride film by applying an adequate electric potential to the gate electrode, source/drain and substrate. When electrons are trapped in the silicon nitride film, the threshold voltage of the MONOS transistor is larger than when electrons are not trapped. Conversely, when the trapped electrons are pulled out of the silicon nitride film, the threshold voltage decreases. Taking advantage of such change in the threshold voltage, the MONOS transistor can store data "1" and "0" in a nonvolatile manner. In other words, the charge trapping memory stores data by using the MONOS transistor as a memory cell transistor.

A conventional charge trapping memory (TwinMONOS) exists in which one memory cell has two MONOS transistors. Two control gates are formed on both sides of a word gate and an ONO film is formed between each control gate and a substrate. In other words, two MONOS transistors are formed on both sides of a word gate and one memory cell can record 2-bit data. When reading data, the 2-bit data are classified into bits to be read and the other bits. Hereinafter, the control gate for the bits to be read is referred to as "read CG" and the other control gate is referred to as an "override CG."

Data reading in the conventional charge trapping memory is divided into a standby stage and a reading stage. In the standby stage, the read CG and override CG are each precharged to a power supply potential (1.8 V). The potential applied to the word gate is 0 V. In the subsequent reading stage, while the read CG remains electrically connected to the power supply, the override CG is set to a floating state. Furthermore, power supply potential (1.8 V) is applied to the word gate. At this time, since the read CG remains electrically connected to the power supply, its potential remains 1.8 V. On the other hand, the potential of the override CG in the floating state is boosted to approximately 2.5 V due to capacitive coupling with the word gate.

SUMMARY

However, the present inventor has recognized the following point. Namely, in order to increase the speed of reading data from the above MONOS transistor, the control gate potential must be quickly boosted to a prescribed read potential. Because the resistance of the control gate is high, a possible approach to increasing the potential is formation of silicide on the upper surface of the gate. However, there is a concern about the possibility that shorting may occur between the silicide formed on the upper surface of the control gate and the silicide formed on the word gate or the upper surface of the source/drain diffusion layer. An alternative approach may be to provide a lining with a low-resistance wiring at frequent intervals. In this case, however, the memory area must be larger.

A possible solution to the above problem may be to fix the potential of the control gate to the "prescribed read potential level" in advance and turn on/off only the word gate for reading operation. Because it is unnecessary to boost the potential of the control gate in the reading stage, the data read speed is improved. In this case, however, the high read potential (stress) is continuously applied to all control gates even while data reading is not being performed. As a consequence, stored data could be affected by a Fowler-Nordheim (FN) current or the like. Therefore, stress continuously applied to the control gates might deteriorate the reliability of the memory.

The present invention seeks to solve one or more of the above problems, or to improve upon those problems at least in part.

In one exemplary embodiment, a nonvolatile semiconductor memory according to the present invention includes a memory cell, a first gate control circuit that is coupled to the memory cell, and a second gate control circuit that is coupled to the memory cell. The memory cell includes a first gate electrode that is formed above a channel region in a semiconductor substrate, a second gate electrode that is formed beside the first gate electrode, and that is capacitively coupled with the first gate electrode through a first insulating layer, and a charge trapping layer that is formed between the channel region and the second gate electrode, and that includes a second insulating layer for trapping a charge. Data stored in a memory cell transistor including the second gate electrode changes depending on an amount of the charge trapped in the charge trapping layer. The first gate control circuit applies a potential to the first gate electrode, when reading the data stored in the memory cell transistor. The second gate control circuit brings the second gate electrode into a floating state, when the potential is applied to the first gate electrode.

In another exemplary embodiment, an apparatus according to the present invention includes a first control unit, a second control unit, and a memory cell. The memory cell includes a substrate, a first gate that is formed above the substrate, and that is coupled to the first control unit, a second gate that is formed beside the first gate through an insulating layer, and that is coupled to the second control unit, and a charge storage layer that is formed between the substrate and the second gate. The first control unit applies a potential to the first gate, when data stored in the charge storage layer is read. The second control unit brings the second gate into a floating state, when the first control unit applies the potential to the first gate.

In yet another exemplary embodiment, a method according to the present invention relates to reading data from a memory cell. The memory cell includes a first gate electrode that is formed above a channel region in a semiconductor substrate, a second gate electrode that is formed beside the first gate electrode, and that is capacitively coupled with the first gate electrode through a first insulating layer, and a charge trapping layer that is formed between the channel region and the second gate electrode, and that includes a second insulating layer for trapping a charge. Data stored in a memory cell transistor including the second gate electrode changes depending on an amount of the charge trapped in the charge trapping layer. The method includes applying a potential to the first gate electrode, when the data stored in the memory cell transistor is read, and bringing the second gate electrode into a floating state, when the potential is applied to the first gate electrode.

As explained above, when reading data in a memory cell transistor as the object of reading, the second gate electrode of the memory cell transistor is set to a floating state and a first potential is applied to the first gate electrode next to the second gate electrode. As a consequence, the potential of the second gate electrode rises to a prescribed read potential due to capacitive coupling with the first gate electrode. Because the potential rises due to the capacitive coupling, a delay does not occur in the second gate electrode, so that high speed data reading is achieved. Since silicide or lining wiring is not always needed, shorting and an increase in the required area are prevented and the manufacturing process is simplified.

In addition, since the potential of the second control gate rises to the prescribed read potential due to the capacitive coupling with the first gate electrode, it is not necessary to precharge the second control gate to the read potential. Even when it is precharged in advance, the precharge potential is set to a level lower than the read potential. Hence, stress on the second control gate is reduced. Besides, it is only in the second gate electrode next to the first gate electrode that the potential rises to the prescribed read potential due to the capacitive coupling with the first gate electrode. The potentials of the other second gate electrodes remain low. Thus, overall stress on the second gate electrodes, namely stored data, is reduced. As a consequence, the reliability of the memory is improved.

According to the present invention, high speed data reading can be achieved without deterioration in the reliability of the memory.

BRIEF DESCRIPTION OF THE DRAWINGS

The above and other purposes, advantages and features of the present invention will become more apparent from the following description of certain exemplary embodiments taken in conjunction with the accompanying drawings in which.

DETAILED DESCRIPTION OF THE EXEMPLARY EMBODIMENTS

The invention will now be described herein with reference to illustrative exemplary embodiments. Those skilled in the art will recognize that many alternative embodiments can be accomplished using the knowledge of the present invention, and that the invention is not limited to the exemplary embodiments illustrated for explanatory purposes.

First Exemplary Embodiment

Figure 1:
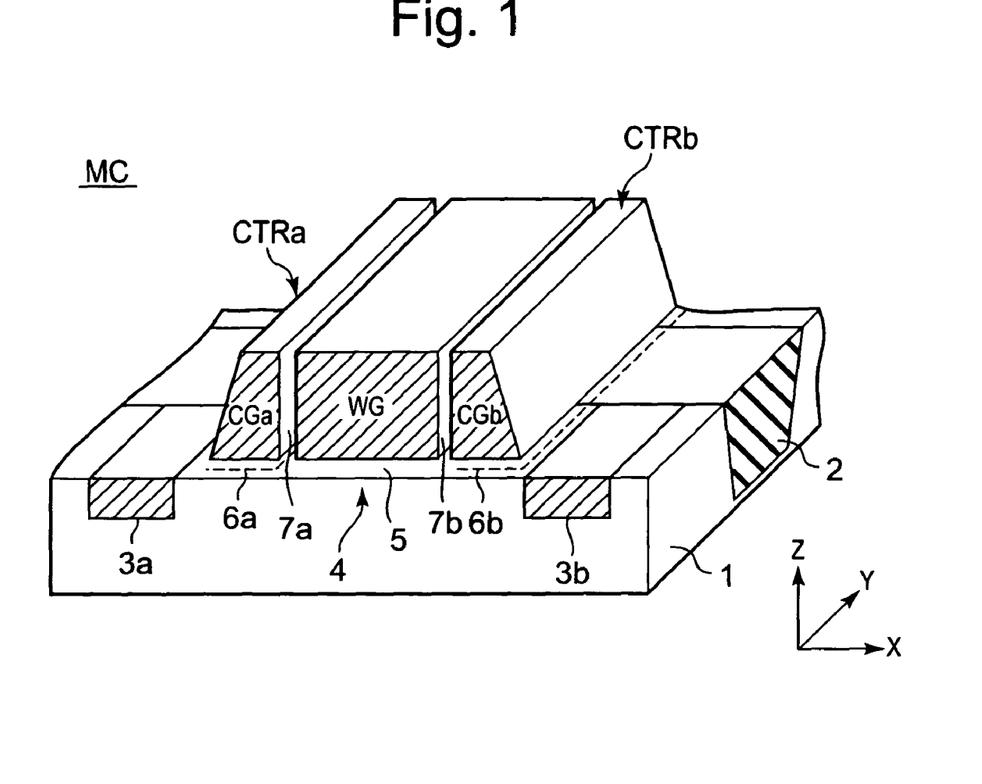
FIG. 1 is a schematic diagram showing a memory cell MC of a nonvolatile semiconductor memory 10 according to a first exemplary embodiment.

FIG. 1 schematically illustrates the memory cell MC of a nonvolatile semiconductor memory according to a first exemplary embodiment. A device isolation structure 2 for isolation between devices is formed in a semiconductor substrate 1. The device isolation structure 2 is, for example, a shallow Trench Isolation (STI) structure. Also, diffusion layers 3a and 3b which function as memory cell transistor source/drain are formed in the semiconductor substrate 1. For example, the semiconductor substrate 1 is a P-type silicon substrate (or P-type well) and the diffusion layers 3a and 3b are N-type diffusion layers. The semiconductor region between the diffusion layers 3a and 3b is a channel region 4 and the direction of the channel is in an X direction.

A plurality of gate electrodes are provided over the channel region 4. Specifically, a word gate WG is formed over the channel region 4 through a first gate insulating film 5. Also, a control gate CG is formed over the channel region 4 through a second gate insulating film 6a, 6b. An insulating film 7 is formed between the word gate WG and control gate CG. In other words, the control gate CG is formed beside the word gate WG and capacitively coupled with the word gate WG through the insulating film 7. Preferably, the word gate WG and control gate CG extend parallel to each other along the Y direction as shown in FIG. 1, so that a large overall coupling capacity is obtained.

The second gate insulating film 6a, 6b. between the control gate CG and channel region 4 is a "charge trapping film" which has a property to trap charge. For example, the charge trapping film 6a, 6b is an ONO film in which a silicon oxide film, a silicon nitride film and a silicon oxide film are stacked in order. The silicon nitride film of the ONO film has a property to trap charge. It is also possible to use an ON film, ONON film or nitride film as the charge trapping film 6a, 6b. In connection with the manufacturing process, the insulating film 7 between the word gate WG and control gate CG may be the same as the charge trapping film 6a, 6b. The charge trapping film 6a, 6b should be formed at least between the channel region 4 and control gate CG.

The charge trapping film 6a, 6b, control gate CG, and diffusion layers 3a and 3b which have been described above constitute a MONOS transistor CTR (i.e., memory cell transistor). When electrons are trapped in the silicon nitride film, the threshold voltage of the MONOS transistor CTR is larger than when electrons are not trapped. Conversely, when the trapped electrons are pulled out of the silicon nitride film, the threshold voltage decreases. Taking advantage of such a change in the threshold voltage, the MONOS transistor CTR can store data "1" and "0" in a nonvolatile manner. Put another way, the data stored in the MONOS transistor CTR changes depending on the amount of charge trapped in the charge trapping film 6a, 6b. The memory cell MC stores data by using such MONOS transistor CTR as a memory cell transistor.

In the example shown in FIG. 1, one memory cell MC has two MONOS transistors CTRa and CTRb on both sides of a word gate WG and each of the MONOS transistors CTRa and CTRb includes a control gate CG and a charge trapping film (i.e., 6a, 6b). More specifically, on the diffusion layer 3a side, a control gate CGa is formed with an insulating film 7a between the diffusion layer and the word gate and a charge trapping film 6a is formed between the control gate CGa and channel region 4. On the other hand, on the diffusion layer 3b side, a control gate CGb is formed with an insulating film 7b between the diffusion layer and the word gate and a charge trapping film 6b is formed between the control gate CGb and channel region 4. In this way, the memory cell MC shown in FIG. 1 has a so-called "twin MONOS structure" which includes the MONOS transistor CTRa on the control gate CGa side and the MONOS transistor CTRb on the control gate CGb side. As a result, memory cell MC can store 2-bit data.

With the memory cell MC shown in FIG. 1, data is written, erased and read as follows. In the explanation given below, it is assumed that a bit to be accessed is a bit on the MONOS transistor CTRb (i.e., control gate CGb) side. The same explanation applies even if a bit to be read is a bit on the MONOS transistor CTRa side.

Figure 2:
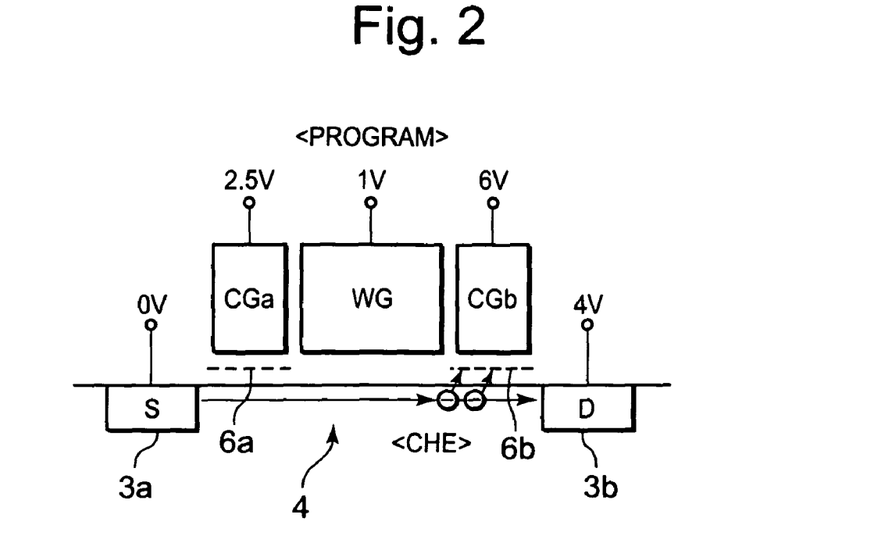
FIG. 2 is a conceptual diagram showing an example of an operation for writing data into the memory cell MC according to the first exemplary embodiment.

FIG. 2 is a conceptual diagram showing an example of a data writing operation. Data is written by a Channel Hot Electron (CHE) method. For example, write potentials +1 V, +2.5 V, +6 V, 0 V, and +4 V are applied to the word gate WG, control gate CGa, control gate CGb, diffusion layer 3a and diffusion layer 3b, respectively. At this time, the diffusion layer 3a on the control gate CGa side functions as a source and the diffusion layer 3b on the control gate CGb side functions as a drain. Electrons in the channel region 4 are accelerated by an intense electric field between the word gate WG and control gate CGb, or by an intense electric field in the vicinity of the drain 3b, to become channel hot electrons. Some of the generated channel hot electrons are injected into the charge trapping film 6b under the control gate CGb. As a consequence, the threshold voltage of the MONOS transistor CTRb on the control gate CGb side increases. It is also possible that the same write potential is applied to both the control gates CGa and CGb.

Figure 3:
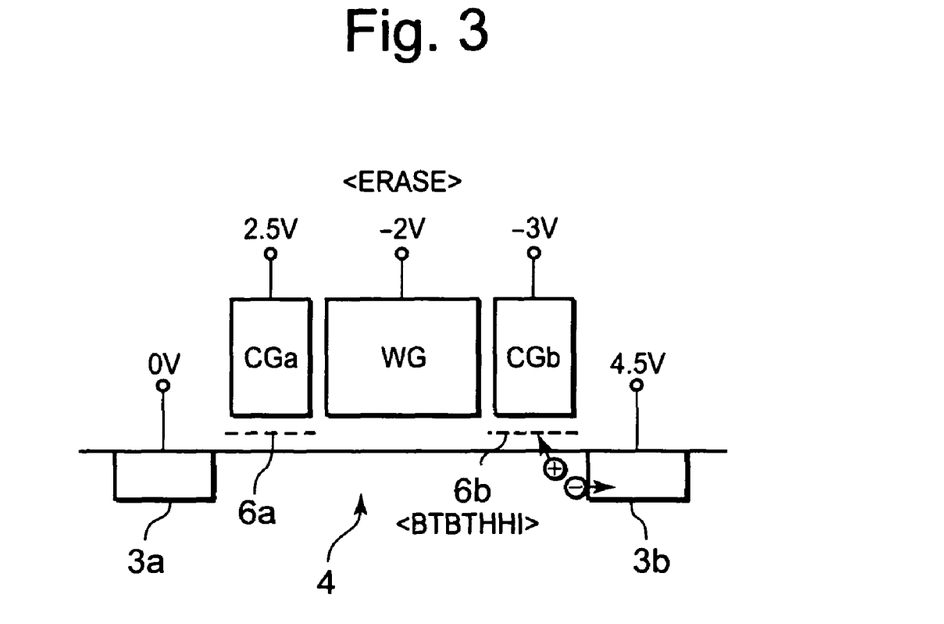
FIG. 3 is a conceptual diagram showing an example of an operation for erasing data in the memory cell MC according to the first exemplary embodiment.

FIG. 3 is a conceptual diagram showing an example of a data erasing operation. Data is erased by a Hot Hole Injection (HHI) method. For example, erase potentials −2 V, +2.5 V, −3 V, 0 V, and +4.5 V are applied to the word gate WG, control gate CGa, control gate CGb, diffusion layer 3a and diffusion layer 3b, respectively. The channel is not conductive because a negative potential (−2 V) is applied to the word gate WG. On the other hand, a negative potential (−3 V) is applied to the control gate CGb and a positive potential (+4.5 V) is applied to the diffusion layer 3b, an intense field is generated between the control gate CGb and diffusion layer 3b.

Since an intense field is applied to a depletion layer around an end of the diffusion layer 3b, a "Band-to-Band tunnel" phenomenon occurs in the depletion layer. Due to the Band-to-Band tunnel phenomenon, electron-hole pairs are generated in the depletion layer where there are basically no carriers. Electrons in the electron-hole pairs are attracted toward the diffusion layer 3b (+4.5 V). Holes in the electron-hole pairs are attracted toward the channel region 4. At this moment, holes are accelerated by the electric field in the depletion layer to become hot holes. The generated hot holes may collide with a lattice and generate new electron-hole pairs. If the number of generated electron-hole pairs is larger than the number of electron-hole pairs which have disappeared, then an avalanche breakdown occurs. This avalanche breakdown also results in generation of many hot carriers (i.e., hot holes, hot electrons).

As described above, due to the Band-to-Band tunnel phenomenon, many hot holes are generated in the depletion layer and channel region 4. These hot holes are attracted to the negative potential (−3 V) of the control gate CGb. Thus, high-energy hot holes are injected into the charge trapping film 6b under the control gate CGb. As a consequence, the threshold voltage of the MONOS transistor CTRb on the control gate CGb side increases. It is also possible that the same erase potential is applied to both the control gates CGa and CGb.

Figure 4:
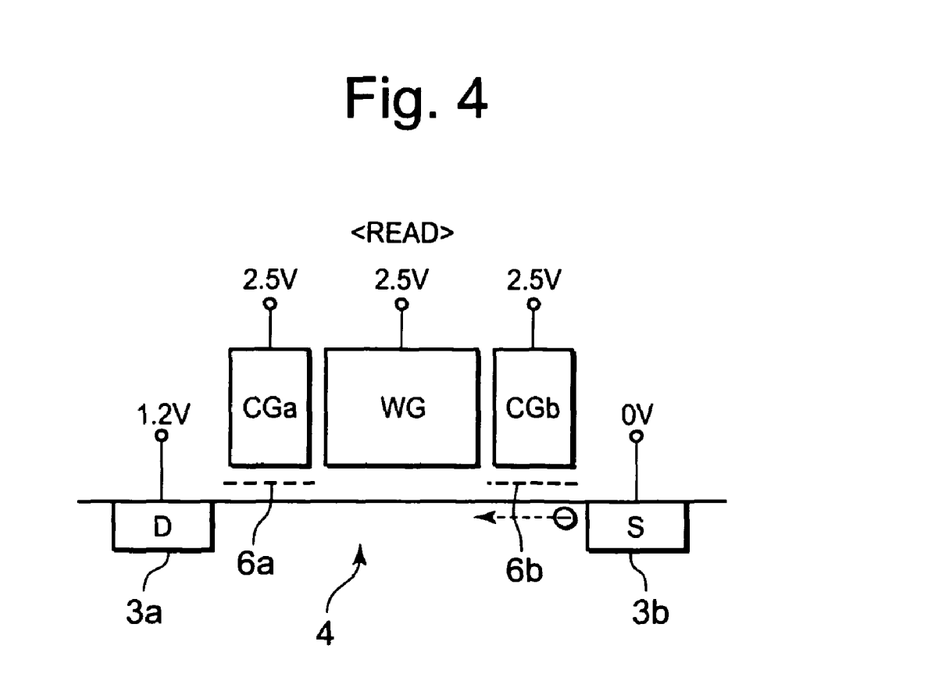
FIG. 4 is a conceptual diagram showing an example of an operation for reading data from the memory cell MC according to the first exemplary embodiment.

FIG. 4 is a conceptual diagram showing an example of a data reading operation. For example, read potentials +2.5 V, +2.5 V, +2.5 V, +1.2 V, and 0 V are applied to the word gate WG, control gate CGa, control gate CGb, diffusion layer 3a and diffusion layer 3b, respectively. At this time, the diffusion layer 3b on the control gate CGb side functions as a source and the diffusion layer 3a on the control gate CGa side functions as a drain.

In a program mode where the threshold voltage is large, the MONOS transistor CTRb on the control gate CGb side is off, and the channel is not conductive. On the other hand, in an erase mode where the threshold voltage is small, the MONOS transistor CTRb is on. When carriers simply reach a region under the control gate CGa, they are sucked (e.g., attracted) into the drain 3a by an electric field in the depletion layer around the drain. In other words, when the MONOS transistor CTRb turns on, the channel becomes conductive regardless of bit data on the control gate CG aside. Hence, a decision can be made on bit data on the control gate CGb side according to the magnitude of a read current flowing in bit lines connected to the diffusion layers 3a and 3b.

In order to improve the data read speed, it is necessary to boost the potential of the control gate CG to a prescribed read potential (+2.5 V) quickly. One possible approach to achieving this is that the potential of the control gate CG is fixed to the read potential (+2.5 V) in advance and in a reading operation, the word gate WG is simply turned on/off repeatedly. In this case, however, the high read potential (+2.5 V) is continuously applied to all control gates CG even while data reading is not being performed. As a consequence, stored data could be affected by FN current or the like. Therefore, stress continuously applied to the control gates might deteriorate the reliability of the memory.

Therefore, according to the first exemplary embodiment, the potential of the control gate CG is boosted to the prescribed read potential (+2.5 V) by utilizing capacitive coupling between the word gate WG and control gate CG. More specifically, when reading data in the MONOS transistor CTRb as the object of reading, the control gate CGb of the MONOS transistor CTRb is set to a "floating state." As a consequence, the potential of the control gate CGb rises to the prescribed read potential (+2.5 V) due to the capacitive coupling with the word gate WG. Because the potential rises due to the capacitive coupling, a delay does not occur in the control gate CGb, permitting high speed data reading. Besides, since it is not necessary to fix the potential of all control gates CG to the read potential (+2.5 V) in advance, stress on the control gates CG is reduced. Thus, according to the first exemplary embodiment, high speed data reading can be achieved without deterioration in the reliability of the memory.

Figure 5:
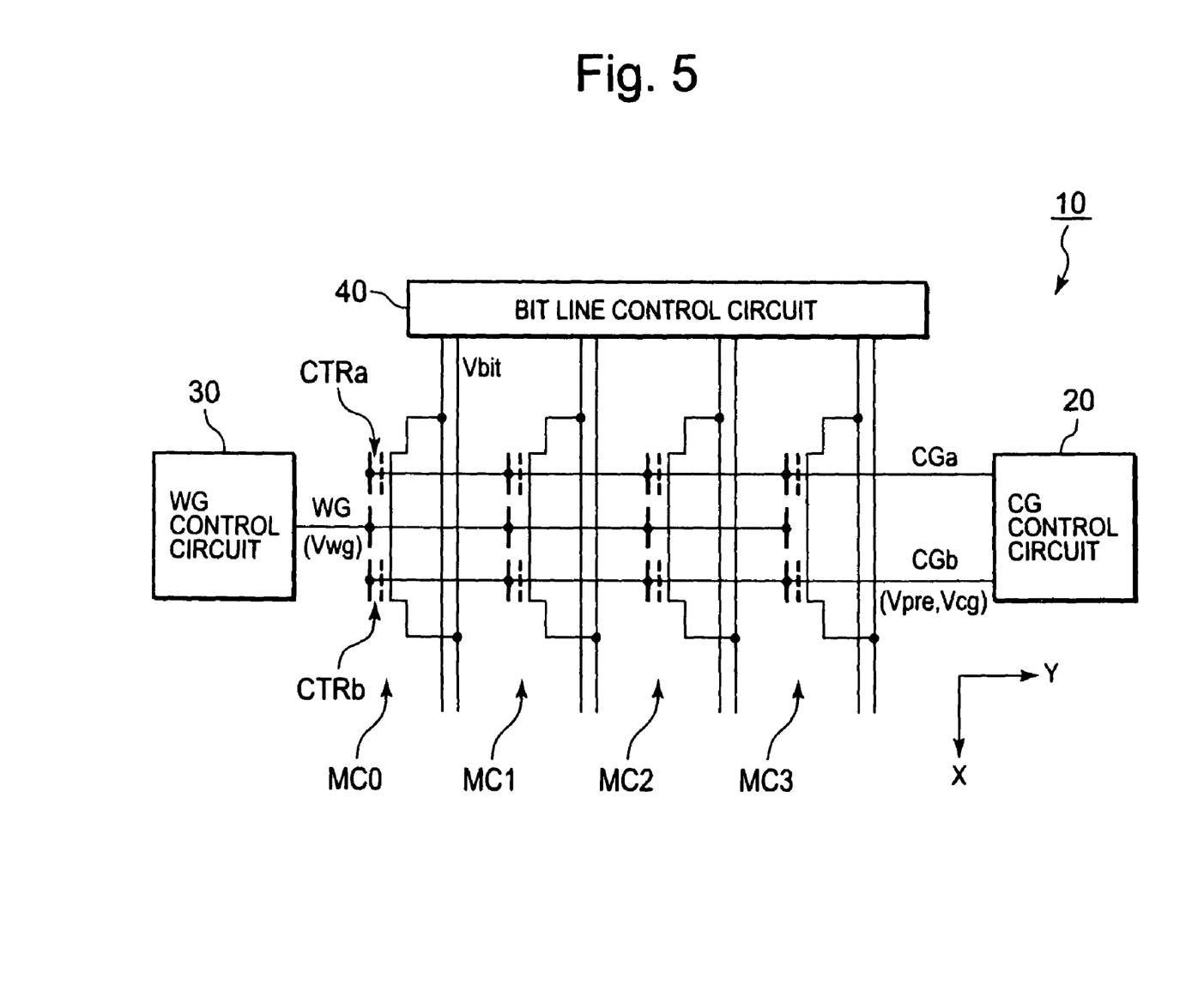
FIG. 5 is a circuit block diagram showing an example of a circuit configuration of the nonvolatile semiconductor memory 10 according to the first exemplary embodiment.

FIG. 5 schematically shows an example of the circuit configuration of the nonvolatile semiconductor memory 10 according to the first exemplary embodiment. For illustration, four memory cells MC0 to MC3 are shown in FIG. 5. Each of the memory cells MC0 to MC3 has the same structure as shown in FIG. 1. The word gate WG and control gates CGa and CGb extend along the Y direction and are shared among the memory cells MC0 to MC3. The diffusion layers 3a and 3b are connected to bit lines extending along the X direction.

As illustrated in FIG. 5, the nonvolatile semiconductor memory 10 includes a CG control circuit 20, a WG control circuit 30, and a bit line control circuit 40 which are connected to the memory cells MC0 to MC3. The CG control circuit 20 is connected to the control gates CGa and CGb to control the potential applied to the control gates CGa and CGb. The WG control circuit 30 is connected to the word gate WG to control the potential applied to the word gate WG. The bit line control circuit 40 is connected through bit lines to the diffusion layers 3a and 3b to control the potential applied to the diffusion layers 3a and 3b.

Referring to FIGS. 4 and 5, data reading according to the first exemplary embodiment is detailed below. For illustration, it is assumed that the object of reading is data stored in the MONOS transistor CTRb of the memory cell MC0.

First, prior to reading data, the CG control circuit 20 precharges (presets) all control gates CGa and CGb to a prescribed precharge potential Vpre. The potential Vcg of the control gates CGa and CGb becomes the precharge potential Vpre. As will be described later, this precharge potential Vpre is lower than the prescribed read potential (+2.5 V). In this stage, the potential of all the word gates WG is 0 V, and the potential of the diffusion layers 3a and 3b is also 0 V.

Then, in the data reading operation, the memory cell MC0 as the object of reading is selected. The WG control circuit 30 selects a word gate WG connected to the memory cell MC0 as the object of reading and applies the read potential Vwg (+2.5 V) to the selected word gate WG. Also, the bit line control circuit 40 selects a bit line connected to the memory cell MC0 as the object of reading and applies the read potential Vbit to the selected bit line. In the example shown in FIG. 4, the read potentials Vbit applied to the diffusion layers 3a and 3b are +1.2 V and 0 V respectively.

At this time, the control gate CGb of the MONOS transistor CTRb as the object of reading is set to a "floating state." This means that the electric connection between the control gate CGb of the MONOS transistor CTRb as the object of reading and the power supply is broken. Several methods for breaking the connection are possible. For example, the CG control circuit 20 "actively" breaks the electric connection between the control gate CGb and the power supply just before the read potential Vwg is applied to the word gate WG. Alternatively, the CG control circuit 20 may "automatically" break the electric connection between the control gate CGb and the power supply in response to application of the read potential Vwg to the word gate WG. Regardless of the method, the CG control circuit 20 brings the control gate CGb into a floating state at least when the read potential Vwg is applied to the word gate WG.

The control gate CGb is capacitively coupled with the adjacent word gate WG and diffusion layer 3b. Assume that the "capacitive coupling ratio" which represents the degree of capacitive coupling between the control gate CGb and the word gate WG next to the control gate CGb is CR1. For example, if the potential of the word gate WG rises by 1 V and in response the potential of the control gate CGb rises by 0.6 V, then capacitive coupling ratio CR1 is 60% (0.6). Similarly, assume that the capacitive coupling ratio between the control gate CG band diffusion layer 3b is CR2. When read potentials Vwg and Vbit are applied to the control gate WG and diffusion layer 3b respectively, the potential Vcg of the control gate CGb, which has been brought into a floating state since the electric connection to the power supply is broken, is given by the following equation (1).

$$Vcg = Vpre + CR1 \times Vwg + CR2 \times Vbit \quad (1)$$

In other words, when reading data, the potential Vcg of the control gate CGb next to the selected word gate WG rises from the precharge potential Vpre to the potential given by the equation (1). More generally, the potential Vcg of the control gate CGb changes from the precharge potential Vpre to a potential whose absolute value is larger than the precharge potential Vpre. The potential Vcg given by the above equation (1) is the read potential (+2.5 V) required to read data. Conversely, the precharge potential Vpre should be set so as to obtain the required read potential (+2.5 V). The set value of precharge potential Vpre is given by the following equation (2).

$$Vpre = Vcg - CR1 \times Vwg - CR2 \times Vbit \quad (2)$$

For example, in the read potential condition shown in FIG. 4, Vcg=+2.5 V, Vwg=+2.5 V, and Vbit=0 V. If the capacitive coupling ratios CR1 and CR2 are 60% (0.6) and 30% (0.3), respectively, then the precharge potential Vpre is 1 V. Hence, in the above precharging operation, the CG control circuit 20 sets the potential Vcg of the control gates CGa and CGb to 1 V. Then, when the control gate CGb is brought into a floating state and the read potential VWG (or +2.5) V is applied to the word gate WG, the potential Vcg of the control gate CGb rises to the prescribed read potential (or +2.5 V) due to the capacitive coupling expressed by the equation (1).

In the first exemplary embodiment, it should be noted that the precharge potential Vpre (example: 1 V) given by the equation (2) is sufficiently lower than the prescribed read potential (example: 2.5 V). More generally, the absolute value of precharge potential Vpre is sufficiently smaller than the absolute value of the read potential required to read data. In order to make a decision on the data (i.e., threshold voltage) stored in the MONOS transistor CTRb as the object of reading, the read potential must be somewhat high. Concretely, the read potential (example: 2.5 V) should be set so that in the program mode in which the threshold voltage is large, the MONOS transistor CTRb is off and in the erase mode in which the threshold voltage is small, the MONOS transistor CTRb is on. On the other hand, the magnitude of precharge potential Vpre is set to a value far smaller than the read potential. Hence, in a precharged state in which the precharge potential Vpre (example: 1 V) is applied to the control gate CGb, the MONOS transistor CTRb turns off regardless of the stored data.

Depending on the design, the precharge potential Vpre calculated by the equation (2) maybe 0 V. Application of precharge potential Vpre of 0 V is also included in the precharging operation.

When the data stored in the MONOS transistor CTRb as the object of reading is read, a similar potential control of the other MONOS transistor CTRa (i.e., not the object of reading) is possible. Specifically, at the same time when the control gate CGb as the object of reading is set to a floating state, the other control gate CGa is also set to a floating state. If the precharge potential Vpre which is applied to both the control gates CGa and CGb is the same (or 1 V), the potentials of both the control gates CGa and CGb rise to +2.5 V (see FIG. 4). Alternatively, the precharge potential Vpre may be different between the control gates CGa and CGb. In that case, while the potential of the control gate CGb changes to +2.5 V, the potential of the control gate CGa changes to a potential which is not +2.5 V. Even if that is the case, data reading is possible.

Here, it should be noted that only in the control gates CGa and CGb next to the selected word gate WG, the potential changes from the precharge potential Vpre due to capacitive coupling. In the example shown in FIG. 5, when the read potential Vwg is applied to the selected word gate WG, only in the control gates CGa and CGb of the memory cells MC0 to MC3, the potential changes from the precharge potential Vpre to the read potential (2.5 V). In the control gates CG of the other memory cells, the potential remains low or at the precharge potential Vpre (1 V).

As explained above, according to the first exemplary embodiment, the absolute value of the precharge potential Vpre is smaller than the absolute value of the read potential and control gates CG to which a high read potential is applied are limited to those next to a selected word gate WG. This means that overall stress on control gates, namely stored data, is reduced. As a consequence, stored data is prevented from being affected by FN current or the like, and the reliability of the memory is improved.

Figure 6:
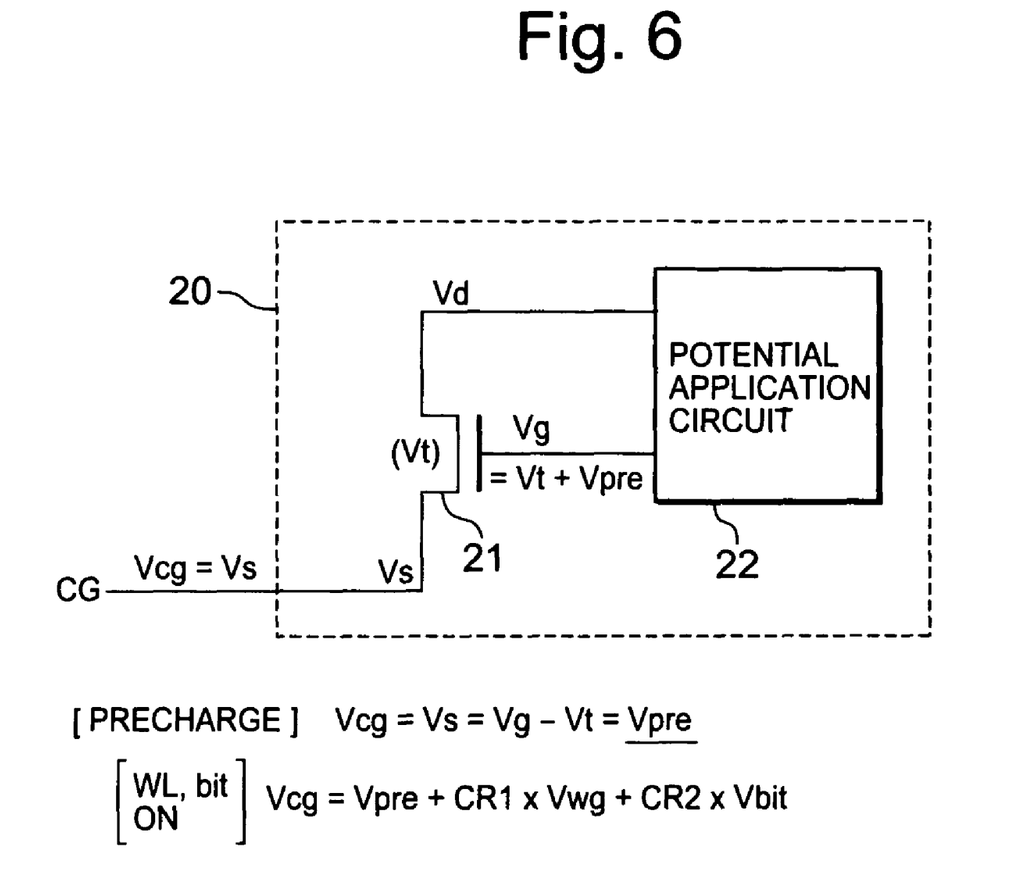
FIG. 6 is a circuit block diagram showing an example of a configuration of a CG control circuit 20 according to the first exemplary embodiment.

FIG. 6 shows an example of the CG control circuit 20. The CG control circuit 20 shown in FIG. 6 includes an N-channel transistor 21 and a potential application circuit 22. The N-channel transistor 21 is interposed between the power supply and control gate CG and performs the function of connecting or disconnecting the power supply and control gate CG electrically. Specifically, the source of the N-channel transistor 21 is connected to the control gate CG and its gate and drain are connected to the potential application circuit 22.

The potential application circuit 22 applies prescribed potentials to the gate and drain of the N-channel transistor 21 respectively. Here, assume that the potentials of the gate, source, and drain of the N-channel transistor 21 are Vg, Vs, and Vd, respectively. Also, assume that the threshold voltage of the N-channel transistor 21 is Vt. The threshold voltage Vt is the voltage between the gate and source when the N-channel transistor 21 turns on. At this time, the potential application circuit 22 sets the drain voltage Vd to an appropriately high level and sets the gate potential Vg to the potential given by the following equation (3).

$$Vg = Vt + Vpre \quad (3)$$

In other words, the gate potential Vg is set to a level equal to the desired precharge potential Vpre plus the threshold voltage Vt. At this time, the N-channel transistor 21 turns on and the source potential Vs is given by the following equation (4).

$$Vs = Vg - Vt = Vpre \quad (4)$$

In other words, the precharge potential Vpre appears at the source of the N-channel transistor 21. Since the source is connected to the control gate CG, the potential Vcg of the control gate CG becomes equal to the source potential Vs. Thus, the desired precharge potential Vpre is applied to the control gate CG.

Then, in a reading operation, as a word gate WG and a bit line are selected, as explained above, the potential Vcg of the control gate CG rises from the precharge potential Vpre to the read potential given by the above equation (1). As a consequence, the source potential Vs also rises to the read potential which is higher than the precharge potential Vpre. On the other hand, the potential application circuit 22 does not change the gate potential Vg. Hence, the voltage between the gate and source becomes smaller than the threshold voltage Vt, and the N-channel transistor 21 turns off. In other words, the electric connection between the control gate CG and power supply is automatically broken, and the control gate CG is automatically brought into a floating state.

As discussed above, the CG control circuit 20 shown in FIG. 6 can apply the precharge potential Vpre to the control gate CG in a precharging operation. Furthermore, in response to application of read potential Vwg to the word gate WG, the CG control circuit 20 can automatically break the electric connection between the control gate CG and power supply. Since there is no need to input an extra control signal in order to break the electric connection, control is easier and the circuit area can be reduced.

Figure 7:
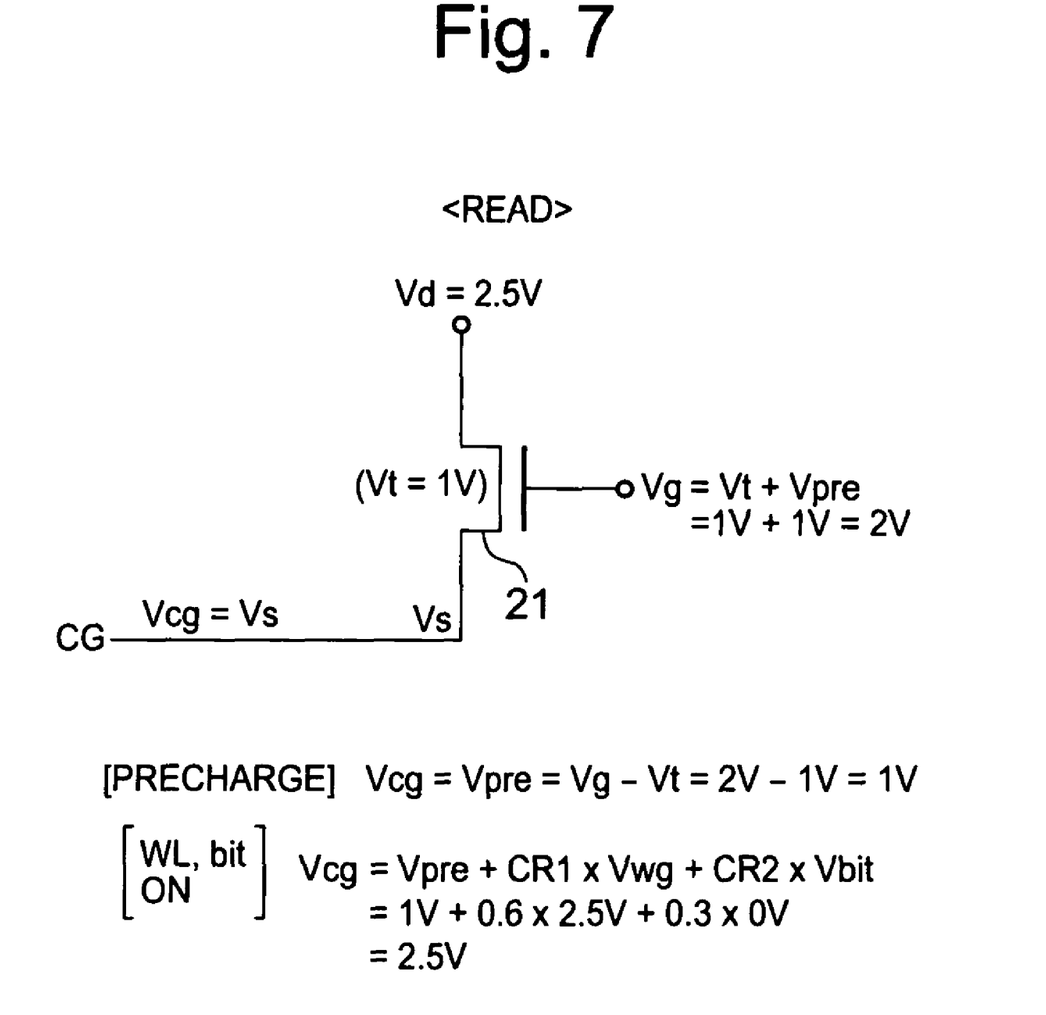
FIG. 7 is a conceptual diagram showing an example of an operation of the CG control circuit 20 shown in FIG. 6.

FIG. 7 shows a concrete example of an applied potential when reading data. The drain potential Vd of the N-channel transistor 21 is set to, for example, 2.5 V. Assume that the threshold voltage Vt of the N-channel transistor 21 is 1 V. In this case, since the desired precharge potential Vpre is 1 V, the gate potential Vg of the N-channel transistor 21 is set to 2 V (see the equation (3)). As a consequence, the source potential Vs is 1 V in a precharging operation (see the equation (4)). In other words, the potential Vcg of the control gate CG becomes equal to the desired precharge potential Vpre (or 1 V). In a reading operation, as a word gate WG and a bit line are selected, the potential Vcg of the control gate CG rises from 1 V to 2.5 V (see the equation (1)). The gate potential Vg and drain potential Vd remain unchanged and the source potential Vs becomes 2.5 V, so that the N-channel transistor 21 automatically turns off.

Figure 8:
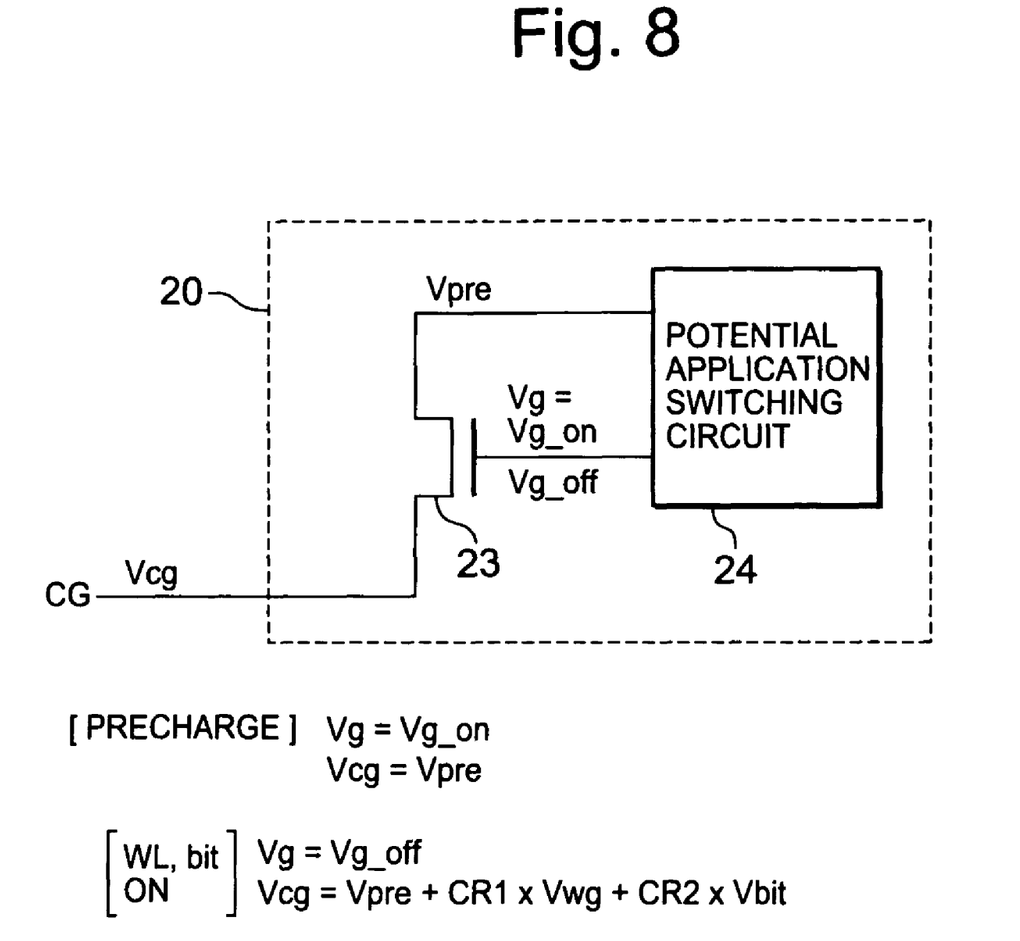
FIG. 8 is a circuit block diagram showing another example of the configuration of the CG control circuit 20 according to the first exemplary embodiment.

FIG. 8 shows another example of the CG control circuit 20. The CG control circuit 20 shown in FIG. 8 includes a switch transistor 23 and a potential application switching circuit 24. The switch transistor 23 is interposed between the power supply and control gate CG and performs the function of connecting or disconnecting the power supply and control gate CG electrically. Either one of the source and drain of the switch transistor 23 is connected to the control gate CG and the other one (hereinafter referred to as the "precharge terminal") is connected to the potential application switching circuit 24. The gate of the switch transistor 23 is connected to the potential application switching circuit 24.

The potential application switching circuit 24 applies prescribed potentials to the gate and precharge terminal of the switch transistor 23. Specifically, the potential application switching circuit 24 applies a desired precharge potential Vpre to the precharge terminal and gate potential Vg to the gate. In this example, the potential application switching circuit 24 switches the gate potential Vg applied to the gate between Vg_on and Vg_off.

First, in a precharging operation, the potential application switching circuit 24 applies a sufficient first gate potential Vg_on to turn on the switch transistor 23, to the gate. As the sufficient first gate potential Vg_on is applied, the switch transistor 23 turns on and the desired precharge potential Vpre is applied to the control gate CG.

After the precharging operation, before the read potential Vwg is applied to the word gate Wg, the potential application switching circuit 24 switches the gate potential Vg from the first gate potential Vg_on to the second gate potential Vg_off. The second gate potential Vg_off is a gate potential to turn off the switch transistor 23. Since the switch transistor 23 turns off, the electric connection between the control gate CG and power supply is broken and the control gate CG is brought into a floating state.

As discussed above, the CG control circuit 20 shown in FIG. 8 applies the precharge potential Vpre to the control gate CG in the precharging operation and then "actively" breaks the electric connection between the control gate CG and power supply. After that, the read potential Vwg is applied to the word gate WG and the potential Vcg of the control gate CG rises from the precharge potential Vpre to the prescribed read potential.

Figure 9:
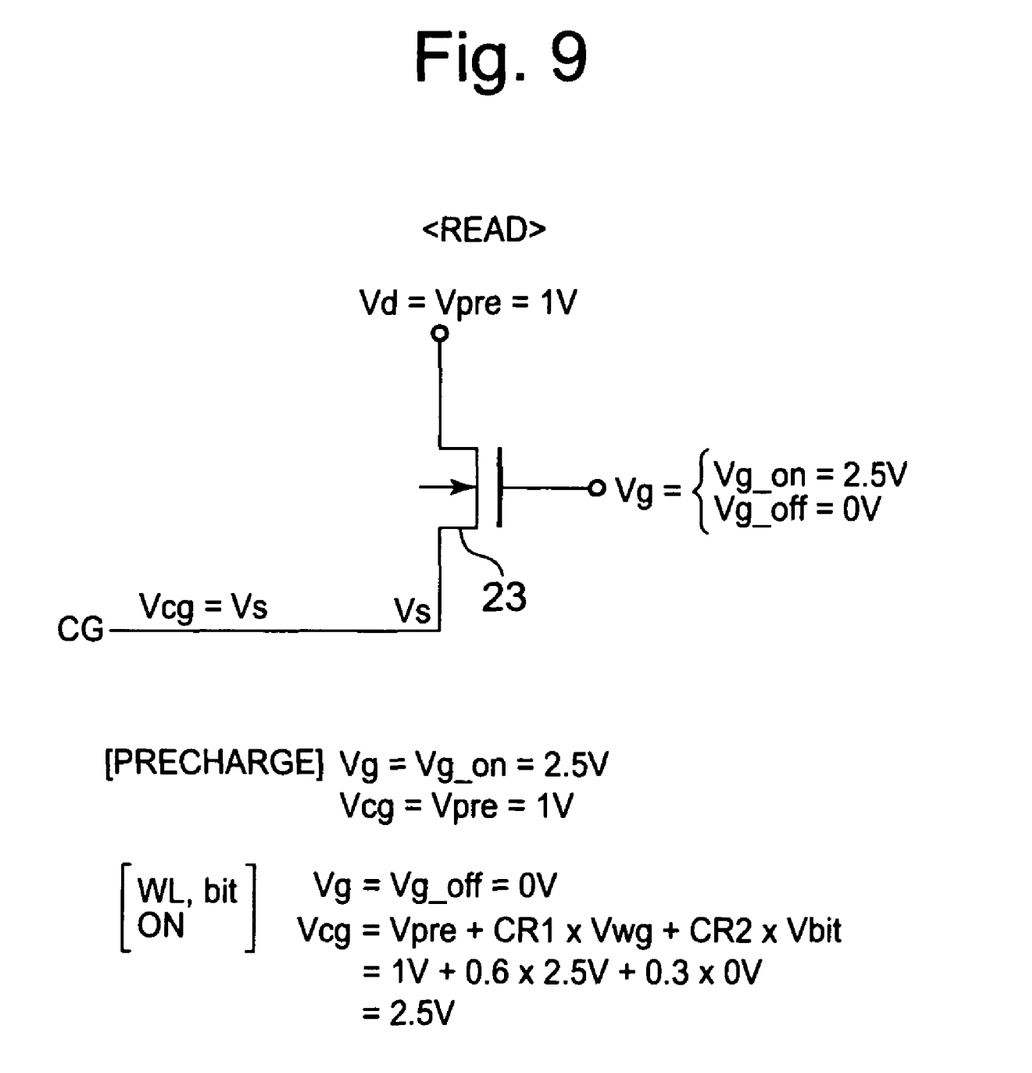
FIG. 9 is a conceptual diagram showing an example of an operation of the CG control circuit 20 shown in FIG. 8.

FIG. 9 shows an example of applied potential in the case that the switch transistor 23 is an N-channel transistor. In this case, the source of the switch transistor 23 is connected to the control gate CG and the drain is a precharge terminal. The drain potential Vd is set to the desired precharge potential Vpre (or 1 V). In a precharging operation, for example, a first gate potential Vg_on of +2.5 V is applied to the gate. As a consequence, the switch transistor 23 turns on and the source potential Vs rises to 1 V. In other words, the potential Vcg of the control gate CG becomes equal to the desired precharge potential Vpre (or 1 V). After that, for example, a second gate potential Vg_off of 0 V is applied to the gate. As a consequence, the switch transistor 23 turns off. Furthermore, as a word gate WG and a bit line are selected in a reading operation, the potential Vcg of the control gate CG rises from 1 V to 2.5 V (see the equation (1)).

Figure 10:
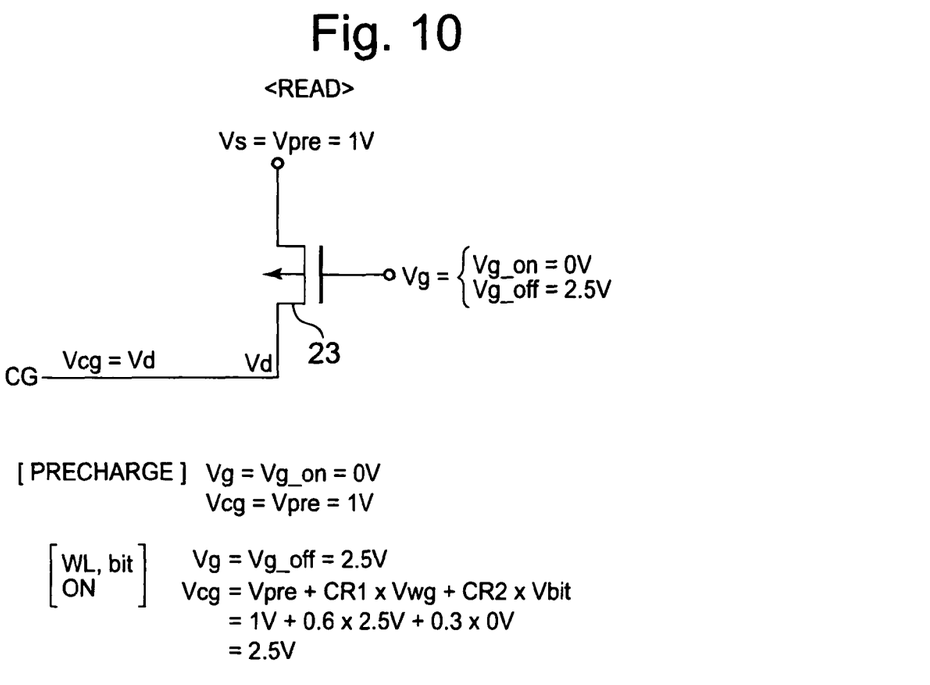
FIG. 10 is a conceptual diagram showing another example of an operation of the CG control circuit 20 shown in FIG. 8.

FIG. 10 shows an example of an applied potential in the case that the switch transistor 23 is a P-channel transistor. In this case, the drain of the switch transistor 23 is connected to the control gate CG and the source is a precharge terminal. The source potential Vs is set to the desired precharge potential Vpre (or 1 V). In precharging operation, for example, a first gate potential Vg_on of 0 V is applied to the gate. As a consequence, the switch transistor 23 turns on and the drain potential Vd rises to 1 V. In other words, the potential Vcg of the control gate CG becomes equal to the desired precharge potential Vpre (or 1 V). After that, for example, a second gate potential Vg_off of 2.5 V is applied to the gate. As a consequence, the switch transistor 23 turns off. Furthermore, since a word gate WG and a bit line are selected in the reading operation, the potential Vcg of the control gate CG rises from 1 V to 2.5 V (see the equation (1)).

According to the first exemplary embodiment, when reading data in a memory cell transistor CTR as the object of reading, a control gate CG of the memory cell transistor CTR is set to a floating state and read potential Vwg is applied to the word gate WG next to the control gate CG. As a consequence, the potential of the control gate CG rises to a prescribed read potential due to capacitive coupling with the word gate WG. Because the potential rises due to the capacitive coupling, a delay does not occur in the control gate CG, so that high speed data reading is achieved. Since silicide or lining wiring is not always needed, shorting and an increase in the required area are avoided and the manufacturing process is simplified.

In addition, since the potential of a control gate CG rises to a prescribed read potential due to capacitive coupling with the word gate WG, it is not necessary to precharge the control gate CG to the read potential. Even when it is precharged in advance, the precharge potential Vpre is set to a level lower than the read potential. Hence, stress on the control gate CG is reduced. Besides, it is only in the control gate CG next to the word gate WG that the potential rises to the prescribed read potential due to the capacitive coupling with the word gate WG. The potentials of the other control gates WG remain low. Thus, overall stress on control gates CG, namely stored data, is reduced. As a consequence, the reliability of the memory is improved.

According to the first exemplary embodiment, high speed data reading can be achieved without deterioration in the reliability of the memory.

Second Exemplary Embodiment

Figure 11:
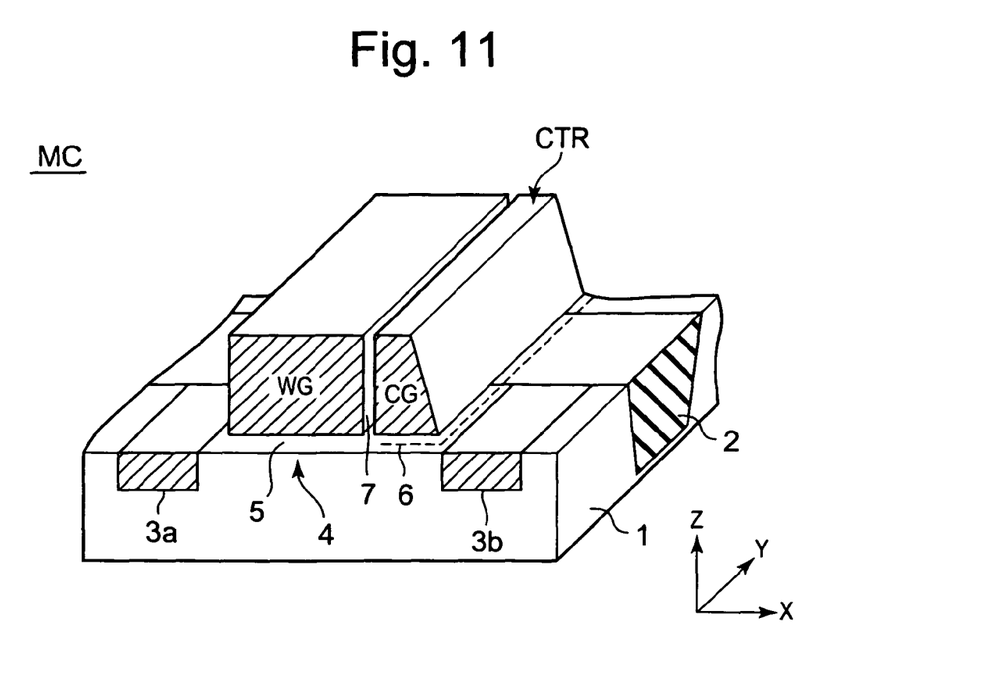
FIG. 11 is a schematic diagram showing a memory cell MC of a nonvolatile semiconductor memory 10 according to a second exemplary embodiment.
Figure 12:
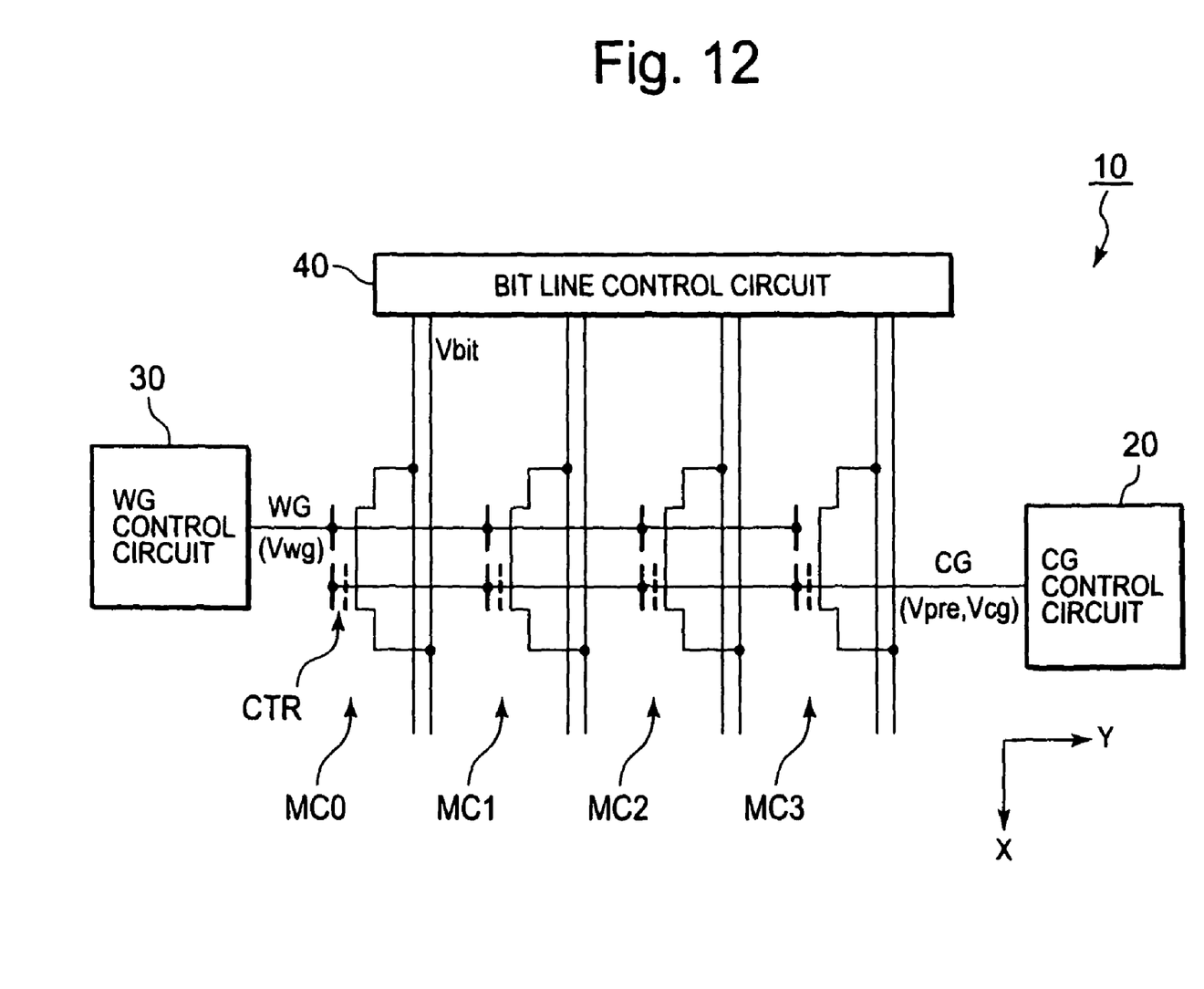
FIG. 12 is a circuit block diagram showing a circuit configuration of the nonvolatile semiconductor memory 10 according to the second exemplary embodiment.

FIG. 11 is a schematic diagram showing a memory cell MC according to a second exemplary embodiment. FIG. 12 shows an example of a circuit configuration of a nonvolatile semiconductor memory 10 which uses the memory cell MC shown in FIG. 11. In the second exemplary embodiment, one memory cell MC only has one MONOS transistor CTR next to a word gate WG. In other words, the second exemplary embodiment corresponds to the first exemplary embodiment from which the MONOS transistor CTRa is removed. Data writing, erasure and reading are the same as in the first exemplary embodiment.

Figure 13:
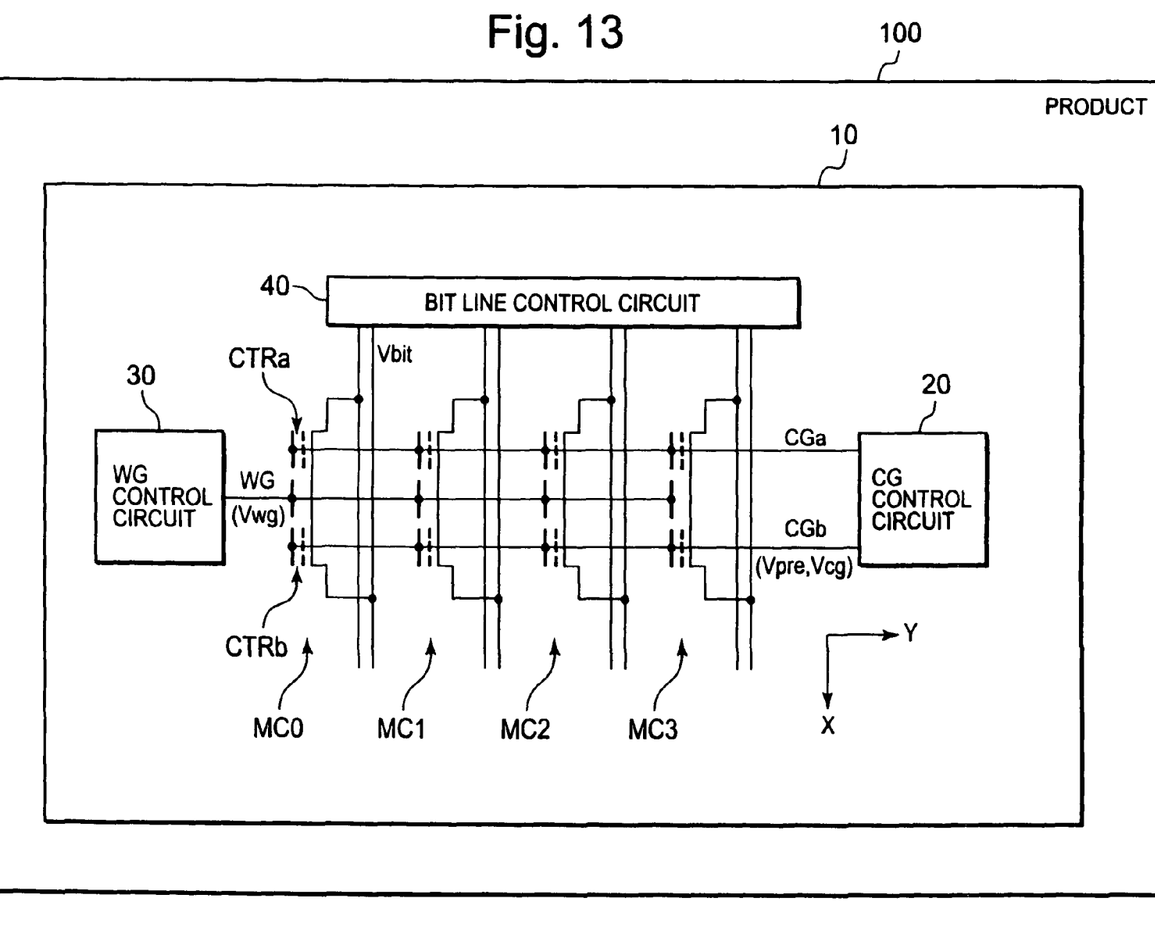
FIG. 13 is a block diagram showing an example of installing the nonvolatile semiconductor memory 10 in a product 100.

Furthermore, as shown in FIG. 13, the nonvolatile semiconductor memory may be installed in various products (a product 100 in FIG. 13), for example, home electric appliances, vehicles, etc. with great benefit.

Although the invention has been described above in connection with several exemplary embodiments thereof, it will be appreciated by those skilled in the art that those exemplary embodiments is provided solely for illustrating the invention, and should not be relied upon to construe the appended claims in a limiting sense.

Further, it is noted that, notwithstanding any claim amendments made hereafter, applicant's intent is to encompass equivalents all claim elements, even if amended later during prosecution.

What is claimed is:
1. A nonvolatile semiconductor memory, comprising:
a memory cell;
a first gate control circuit that is coupled to the memory cell; and
a second gate control circuit that is coupled to the memory cell,
wherein the memory cell comprises:
a first gate electrode that is formed above a channel region in a semiconductor substrate;
a second gate electrode that is formed beside the first gate electrode, and that is capacitively coupled with the first gate electrode through a first insulating layer; and
a charge trapping layer that is formed between the channel region and the second gate electrode, and that comprises a second insulating layer for trapping a charge, wherein data stored in a memory cell transistor including the second gate electrode changes depending on an amount of the charge trapped in the charge trapping layer, wherein the first gate control circuit applies a potential to the first gate electrode, when reading the data stored in the memory cell transistor, and wherein the second gate control circuit brings the second gate electrode into a floating state, when the potential is applied to the first gate electrode.

2. The nonvolatile semiconductor memory according to claim 1, wherein the first gate electrode and the second gate electrode extend parallel to each other.

3. The nonvolatile semiconductor memory according to claim 1, wherein the potential comprises a first potential, and wherein the second gate control circuit precharges the second gate electrode to a second potential before the first potential is applied to the first gate electrode.

4. The nonvolatile semiconductor memory according to claim 3, wherein the memory cell transistor turns off regardless of the data, when the second potential is applied to the second gate electrode.

5. The nonvolatile semiconductor memory according to claim 3, wherein a potential of the second gate electrode changes from the second potential to a third potential whose absolute value is larger than the second potential, when the first potential is applied to the first gate electrode.

6. The nonvolatile semiconductor memory according to claim 5, wherein the second gate control circuit comprises:
a transistor that is formed between a power supply and the second gate electrode, and that includes a source coupled to the second gate electrode, wherein the second potential appears at the source, in a precharging operation for the second gate electrode, and wherein the transistor turns off, as the potential of the second gate electrode changes to the third potential.

7. The nonvolatile semiconductor memory according to claim 3, wherein the second gate control circuit comprises:
an N-channel transistor that is formed between a power supply and the second gate electrode, and includes a source coupled to the second gate electrode; and
a potential application circuit that applies, to a gate of the N-channel transistor, a potential that is equal to the second potential plus a threshold voltage of the N-channel transistor.

8. The nonvolatile semiconductor memory according to claim 3, wherein the second gate control circuit comprises:
a transistor that includes a first node, a second node, and a gate, the first node being coupled to the second gate electrode; and
a potential application switching circuit that is coupled to the gate of the transistor and the second node, wherein the potential application switching circuit applies the second potential to the second node;

wherein the potential application switching circuit applies a potential to turn on the transistor, to the gate of the transistor, in a precharging operation for the second gate electrode, and wherein the potential application switching circuit applies a potential to turn off the transistor, to the gate of the transistor, before the first potential is applied to the first gate electrode, and after the precharging operation.

9. An apparatus, comprising:
a first control unit;
a second control unit; and
a memory cell,
wherein the memory cell comprises:
a substrate;
a first gate that is formed above the substrate, and that is coupled to the first control unit;
a second gate that is formed beside the first gate through an insulating layer, and that is coupled to the second control unit; and
a charge storage layer that is formed between the substrate and the second gate, wherein the first control unit applies a potential to the first gate, when data stored in the charge storage layer is read, and wherein the second control unit brings the second gate into a floating state, when the first control unit applies the potential to the first gate.

10. The apparatus according to claim 9, wherein the potential comprises a first potential, and wherein the second control unit applies a second potential to the second gate, before the first control unit applies the first potential to the first gate.

11. The apparatus according to claim 10, wherein an absolute value of a potential of the second gate rises larger than that of the second potential by capacitive coupling of the second gate with the first gate, after the second control unit brings the second gate into the floating state.

12. The apparatus according to claim 10, wherein an absolute value of the first potential is larger than that of the second potential.

13. The apparatus according to claim 10, wherein the second control unit comprises:
a transistor that is coupled to the second gate; and
a potential control section that is coupled to a gate of the transistor, wherein the potential control section applies a larger potential than the second potential to the gate of the transistor, before the first control unit applies the first potential to the first gate, and wherein the transistor turns off, when the first control unit applies the first potential to the first gate.

14. The apparatus according to claim 10, wherein the second control unit comprises:
a potential control section that generates the second potential; and
a switching section that is coupled to the second gate, and that switches between a state of a connection with the potential control section and a state of a disconnection with the potential control section, in response to a signal outputted from the potential control section, wherein the switching section switches to the state of the connection with the potential control section to output the second potential, before the first control unit applies the first potential to the first gate, and wherein the switching section switches to the state of the disconnection with the potential control section, when the first control unit applies the first potential to the first gate.

15. The apparatus according to claim 10, wherein the charge storage layer comprises a first charge storage layer, wherein the insulating layer comprises a first insulating layer, wherein the memory cell further comprises:
- a third gate that is formed beside the first gate through a second insulating layer, and that is coupled to the first control unit; and
- a second charge storage layer that is formed between the substrate and the third gate, wherein the first gate is positioned between the second gate and the third gate, and wherein the second control unit brings the third gate into the floating state, when the first control unit applies the first potential to the first gate.

16. The apparatus according to claim 15, wherein the second control unit applies a third potential to the third gate, before the first control unit applies the first potential to the first gate.

17. The apparatus according to claim 16, wherein the third potential is substantially equal to the second potential.

18. The apparatus according to claim 15, wherein the data stored in the first charge storage layer is a reading target, and wherein data stored in the second charge storage layer is a reading non-target.

19. A product, comprising the apparatus according to claim 9.

20. A method of reading data from a memory cell, the memory cell comprising a first gate electrode that is formed above a channel region in a semiconductor substrate, a second gate electrode that is formed beside the first gate electrode, and that is capacitively coupled with the first gate electrode through a first insulating layer, and a charge trapping layer that is formed between the channel region and the second gate electrode, and that comprises a second insulating layer for trapping a charge, wherein data stored in a memory cell transistor including the second gate electrode changes depending on an amount of the charge trapped in the charge trapping layer, the method comprising:
- applying a potential to the first gate electrode, when the data stored in the memory cell transistor is read; and
- bringing the second gate electrode into a floating state, when the potential is applied to the first gate electrode.

21. The method according to claim 20, wherein the potential comprises a first potential, and wherein the method further comprises:
- before the applying of the first potential to the first gate electrode, applying a second potential to the second gate electrode.

\* \* \* \* \*